United States Patent
Wang et al.

(10) Patent No.: US 9,817,076 B2
(45) Date of Patent: Nov. 14, 2017

(54) ESTIMATION CIRCUIT FOR SOC AND SOH OF BATTERY

(71) Applicant: NATIONAL SUN YAT-SEN UNIVERSITY, Kaohsiung (TW)

(72) Inventors: Chua-Chin Wang, Kaohsiung (TW); Wen-Je Lu, Kaohsiung (TW); Min-Yu Tseng, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 473 days.

(21) Appl. No.: 14/549,631

(22) Filed: Nov. 21, 2014

(65) Prior Publication Data

US 2016/0103181 A1 Apr. 14, 2016

(30) Foreign Application Priority Data

Oct. 14, 2014 (TW) .............................. 103135441 A

(51) Int. Cl.
*G01V 3/18* (2006.01)
*H02J 7/00* (2006.01)
(Continued)

(52) U.S. Cl.
CPC ....... *G01R 31/3679* (2013.01); *G01R 31/361* (2013.01); *G01R 31/3651* (2013.01)

(58) Field of Classification Search
CPC ............ G01R 31/3679; G01R 31/3651; G01R 31/361; G01R 31/3613; G01R 31/3624;
(Continued)

(56) References Cited

U.S. PATENT DOCUMENTS

| 2007/0029973 A1* | 2/2007 | Ashizawa ............ G01R 31/361 320/132 |
|---|---|---|
| 2011/0148424 A1* | 6/2011 | Chiang .............. G01R 31/3651 324/427 |

(Continued)

FOREIGN PATENT DOCUMENTS

| CN | 102073016 A | 5/2011 |
|---|---|---|
| CN | 102230953 A | 11/2011 |
| TW | 201337297 A | 9/2003 |

OTHER PUBLICATIONS

Chua-Chin Wang et al., An All-digital Battery Capacity Monitor Using Calibrated Current Estimation Approach, Nov. 17, 2014-Nov. 20, 2014.

(Continued)

*Primary Examiner* — Kimberly Rizkallah
*Assistant Examiner* — Brian Turner
(74) *Attorney, Agent, or Firm* — Jackson IPG PLLC; Demian K. Jackson

(57) ABSTRACT

Estimation circuit for SOC and SOH of battery includes a control circuit, a current estimation circuit, an open-circuit voltage detection circuit, an optional multiplexer and an electrical-capacity calculation circuit. The control circuit operates under six modes based on a reset signal, a voltage signal and a current signal. The current estimation circuit comprises a current modification circuit and a Coulomb integral circuit, the current modification circuit receives the current signal and outputs a modifying current signal, the Coulomb integral circuit integrates the modifying current signal to obtain an estimating electrical-capacity value. The open-circuit voltage detection circuit receives the voltage signal and outputs an initial electrical-capacity value. The optional multiplexer receives an estimation optional signal, the estimating electrical-capacity value and the initial electrical-capacity value to output an estimating electrical-ca- (Continued)

pacity signal. The electrical-capacity calculation circuit stores the estimating electrical-capacity signal to calculate battery-electrical-capacity remaining signal and state of health signal.

13 Claims, 7 Drawing Sheets

(51) Int. Cl.
*G01R 31/36* (2006.01)
*G06F 11/30* (2006.01)

(58) Field of Classification Search
CPC ............ G01R 31/3637; G01R 31/3648; G01R 31/3662
See application file for complete search history.

(56) References Cited

U.S. PATENT DOCUMENTS

2013/0041607 A1* 2/2013 Zimmerman .... G01R 19/16542
702/63
2013/0297243 A1* 11/2013 Baba .................. B60L 11/1861
702/63
2014/0074416 A1 3/2014 Park et al.

OTHER PUBLICATIONS

Taiwanese Office Action dated Sep. 2, 2015 for Taiwanese Patent Application No. 103135441, 4 pages.

* cited by examiner

| Mode | reset_MCU | reset_CCEA | sel_predit | EN_N | EN_H | EN_L |
|---|---|---|---|---|---|---|
| Reset mode | 1 | 1 | X | X | X | X |
| OCV buffer mode | 0 | 1 | X | 0 | 0 | 0 |
| OCV mode | 0 | 1 | 0 | 1 | 0 | 0 |
| Over-voltage mode | 0 | 0 | 1 | 1 | 1 | 0 |
| Under-voltage mode | 0 | 0 | 1 | 1 | 0 | 1 |
| Normal mode | 0 | 0 | 1 | 1 | 0 | 0 |

FIG. 7

ESTIMATION CIRCUIT FOR SOC AND SOH OF BATTERY

FIELD OF THE INVENTION

The present invention is generally relating to an estimation circuit, particularly represents to the estimation circuit for state of charge and state of health of battery.

BACKGROUND OF THE INVENTION

In recent years, on the basis of developing personal mobile apparatus, electric vehicle and green energy, the research related to energy storage device-battery tends to become more and more essential. In the field of car-used battery, user has to get over relative information about battery precisely for driving safety. The most vital part is to know well as regard to remained electrical capacity and health state of the battery so far for making the user of electric vehicle knowing about the timing of cut-off charging, cut-off discharging and replacement of the battery.

The present electrical capacity estimation technologies for battery include discharge test, open circuit voltage measuring, internal resistance measuring, loaded voltage measuring, electrolyte concentration measuring, coulomb counting method and so on. However, there are many factors that affect charge-discharge characteristics of the battery, in addition, various types of batteries possess different charge-discharge characteristics respectively. Therefore, except an estimation circuit design aimed at one single type of battery, if we anticipates the estimation circuit to achieve high accuracy and adaptive to multi types of batteries, high cost is needed. Additionally, mentioned estimation circuit must accomplished by application-specific integrated circuit. Thus, it is difficult to apply to portable mobile device.

Besides, the energy release for the battery is to convert chemical energy into electrical energy and discharge to a load. Theoretically, as long as a normal rated current 2000 mAh battery has a discharging current of 2 A, the discharge may last for 1 hour. The same reason, the discharging current of 1 A may discharge continuously for 2 hour. Actually, the chemical reaction speed inside the battery cannot offer required capacity of electric energy in time. Therefore, once the discharging current is increased, the total capacity the battery provides is decreased, which is called as Multiplier Effect. Owing to Synergic Effect, the battery discharges by a synergic-effect current that is larger than previous discharging current. The multiplier-effect current is also named recovery current. Once prior art estimates battery state of charge by discharging current-time integration, the estimating charge/discharge state of charge value is smaller than actual state of charge value caused by current multiplier-effect. That is to say, although a detecting circuit indicates that the battery is charged incompletely in charging condition, actually the battery is already overly charged. Oppositely, although the detecting circuit indicates that the battery has sufficient electrical-capacity in discharging condition, actually there is no remained electrical-capacity for the battery.

SUMMARY

The primary object of the present invention is to provide an estimation circuit for state of charge and state of health of battery that is adaptive to multi types of batteries, the estimation circuit operates under different modes via voltage signal, current signal and reset signal received by the control circuit and stores estimated capacity of electricity value into various registers for detecting state of charge and state of health.

The secondary object of the present invention is to perform modification-type Coulomb integration via current estimation circuit. After performing multiplying modification to detected current signal via current estimation circuit and integrating detected current signal via Coulomb integral circuit for making current signal that has been integrated approach actual recovery current therefore obtaining more precise estimation value of state of charge.

An estimation circuit for state of charge and state of heath of battery includes a control circuit, a current estimation circuit, an open-circuit voltage detection circuit, an optional multiplexer and an electrical-capacity calculation circuit. The control circuit receives a reset signal, a voltage signal and a current signal and determines the voltage level of an electrical-capacity calculation reset signal, an estimation optional signal, an over voltage enable signal, a normal state enable signal, a low voltage enable signal and a current-estimated reset signal outputted from the control circuit on the basis of the reset signal, the voltage signal and the current signal. The current estimation circuit comprises a current modification circuit and a Coulomb integral circuit, wherein the current modification circuit receives the current signal and multiplies the current signal with a modifying parameter to output a modifying current signal, the Coulomb integral circuit receives the modifying current signal and the current-estimated reset signal of the control circuit and integrates the modifying current signal to output an estimating electrical-capacity value. The open-circuit voltage detection circuit receives the voltage signal and outputs an initial electrical-capacity value on the basis of the voltage signal. The optional multiplexer receives the estimation optional signal of the control circuit, the estimating electrical-capacity value of the current estimation circuit and the initial electrical-capacity value of the open-circuit voltage detection circuit and outputs an estimating electrical-capacity signal, wherein the optional multiplexer determines that the estimating electrical-capacity signal equals to the estimating electrical-capacity value or the initial electrical-capacity value. The electrical-capacity calculation circuit comprises an over voltage register, a normal state register and a low voltage register, wherein the over voltage register receives the estimating electrical-capacity signal, the electrical-capacity calculation reset signal and the over voltage enable signal, the normal state register receives the estimating electrical-capacity signal, the electrical-capacity calculation reset signal and the normal state enable signal, the low voltage register receives the estimating electrical-capacity signal, the electrical-capacity calculation reset signal and the low voltage enable signal, wherein the over voltage register, the normal state register and the low voltage register determine whether to store the estimating electrical-capacity signal is controlled by the over voltage enable signal, the normal state enable signal and the low voltage enable signal respectively, wherein the difference value between a signal stored in the normal state register and a signal stored in the low voltage register is a battery-electrical-capacity remaining signal, and the difference value between a signal stored in the over voltage register and a signal stored in the low voltage register a battery state of health signal.

In this invention, the control circuit may operate under six modes and store the initial electrical-capacity value or the estimating electrical-capacity value respectively into the over voltage register, the normal state register and the low voltage register for obtaining state of charge and state of health of battery. Besides, the current estimation circuit modifies the current signal via the current modification circuit to make the modifying current signal approaching the recovery current and enables the Coulomb integral circuit to precisely estimate electrical-capacity value of the battery.

DESCRIPTION OF THE DRAWINGS

FIG. 7 is a diagram illustrating plural numbers corresponded to each signal operated under various mode in a control circuit in accordance with the embodiment of the present invention.

DETAILED DESCRIPTION OF THE INVENTION

Figure 1:
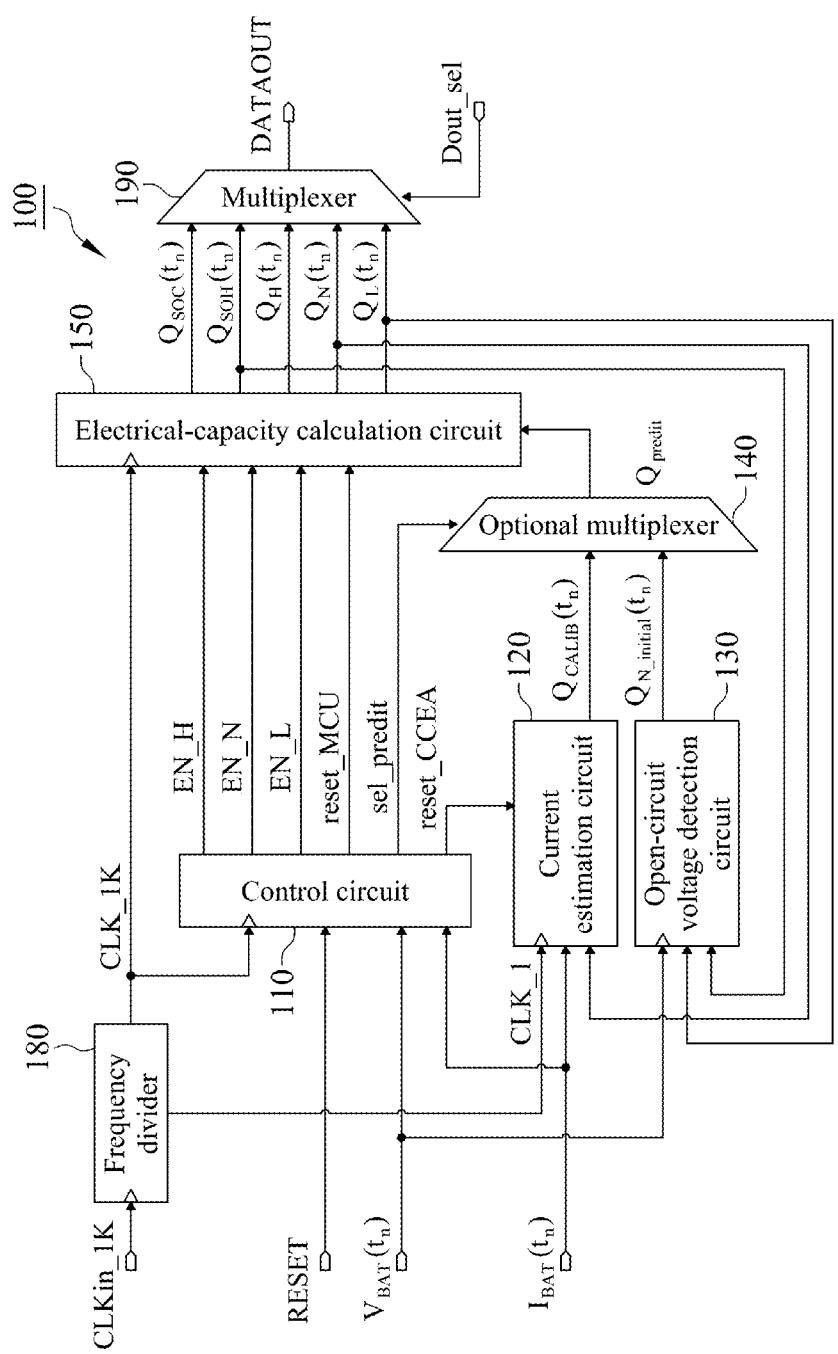
FIG. 1 is a function block diagram illustrating an estimation circuit for state of charge and state of health of battery in accordance with an embodiment of the present invention.
Figure 2:
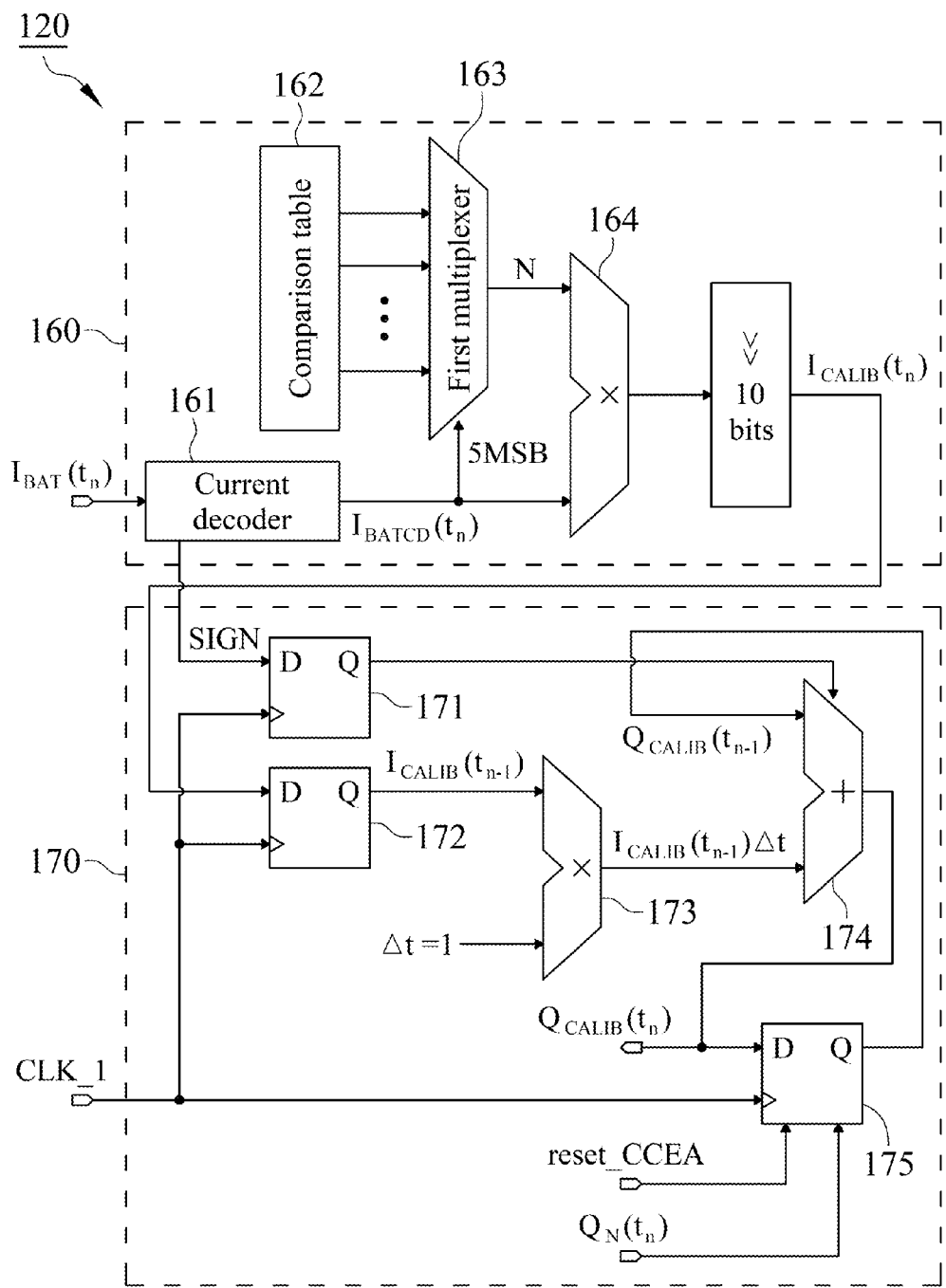
FIG. 2 is a function block diagram illustrating a current estimation circuit in accordance with the embodiment of the present invention.

With reference to FIGS. 1 and 2, an estimation circuit 100 for state of charge and state of heath of battery is utilized for measuring the state of charge and state of health in a battery set, wherein the estimation circuit 100 includes a control circuit 110, a current estimation circuit 120, an open-circuit voltage detection circuit 130, an optional multiplexer 140, an electrical-capacity calculation circuit 150 and a frequency divider 180.

With reference to FIG. 1, the control circuit 110 receives a reset signal RESET, a voltage signal $V_{BAT}(t_n)$ and a current signal $I_{BAT}(t_n)$, wherein a user commands the reset signal RESET to the control circuit 110 via a user interface (not shown in Figs.), the voltage signal $V_{BAT}(t_n)$ and the current signal $I_{BAT}(t_n)$ are obtained by measuring current and voltage of the battery set via a current detector and a voltage detector and transforming into digital signal via a digital/analog converter. With reference to FIG. 7, the control circuit 110 determines the voltage level of an electrical-capacity calculation reset signal reset_MCU, an estimation optional signal sel_predit, an over voltage enable signal EN_H, a normal state enable signal EN_N, a low voltage enable signal EN_L and a current-estimated reset signal reset_CCEA outputted from the control circuit 110 according to the reset signal RESET, the voltage signal $V_{BAT}(t_n)$ and the current signal $I_{BAT}(t_n)$ therefore operating under one of six modes.

With reference to FIG. 2, the current estimation circuit 120 comprises a current modification circuit 160 and a Coulomb integral circuit 170, wherein the current modification circuit 160 receives the current signal $I_{BAT}(t_n)$ and multiplies the current signal $I_{BAT}(t_n)$ with a modifying parameter N to output a modifying current signal $I_{CALIB}(t_n)$, the Coulomb integral circuit 170 receives the modifying current signal $I_{CALIB}(t_n)$ and the current-estimated reset signal reset_CCEA of the control circuit 110 and integrates the modifying current signal $I_{CALIB}(t_n)$ to output an estimating electrical-capacity value $Q_{CALIB}(t_n)$. The current-estimated circuit 120 multiplies the current signal $I_{BAT}(t_n)$ with the modifying parameter N for obtaining the modifying current signal $I_{CALIB}(t_n)$ via a the current modification circuit 160 so as to make the modifying current signal $I_{CALIB}(t_n)$ approaching a recovery current of the battery set therefore precisely estimating the value of electrical capacity in the battery set.

Figure 5:
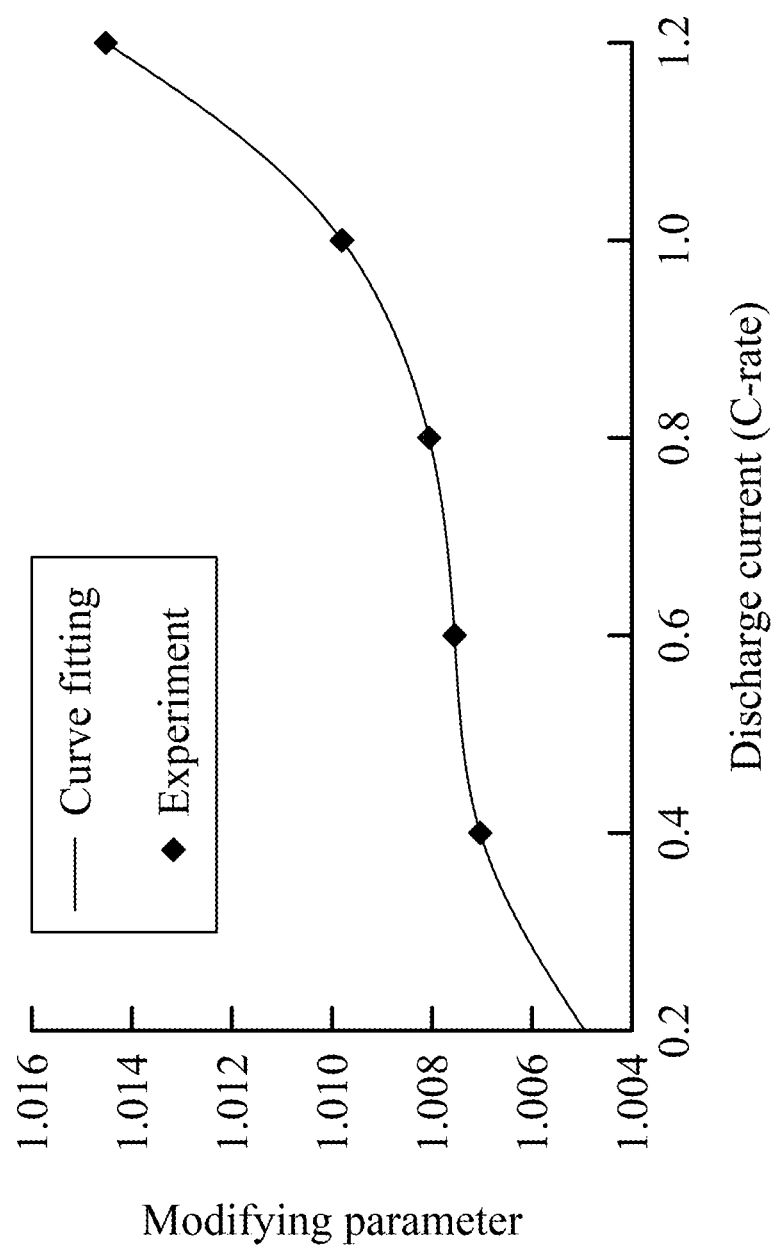
FIG. 5 is a relationship diagram between a discharge current and a modifying parameter in accordance with the embodiment of the present invention.

With reference to FIG. 5, in this embodiment, the way for obtaining the modifying parameter N is: making the battery set charge to a charge cut-off voltage by constant current charging, then switching the mode of charge from constant current to constant voltage and charging to the charge current that is less than 100 mA, discharging the battery set to a discharge cut-off voltage by various magnitudes of constant-value discharge currents and recording their discharging time, wherein the recovery current of the battery set is obtained by the following formula:

$$\text{Recovery current(A)} = \frac{\text{Rated capacity(Ah)}}{\text{Discharging time(h)}}$$

Furthermore, the recovery current of the battery set is obtained by rated capacity of the battery set and the discharging time that discharges to the discharge cut-off voltage, wherein the modifying parameter N is calculated through the following formula:

$$\text{Modifying parameter} = \frac{\text{Recovery current(A)}}{\text{Discharging current(A)}}$$

By ratio relationship between the recovery current and the discharging current, the modifying parameter N corresponded to plural discharging currents is obtained. Next, we may acquire the relation formula between the discharging current and the modifying parameter N via Curve fitting, wherein the relation diagram between the experimental value and the modifying parameter N is illustrated in FIG. 5. Therefore, when the detected discharging current multiplies the corresponded modifying parameter N, the actual equivalent recovery current is obtained.

With reference to FIG. 2, in this embodiment, the current modification circuit 160 comprises a current decoder 161, a comparison table 162, a first multiplexer 163 and a first multiplier 164, the current decoder 161 receives the current signal $I_{BAT}(t_n)$ and decodes the current signal $I_{BAT}(t_n)$ to generate a symbol bit SIGN and a current decoding signal $I_{BATCD}(t_n)$, the first multiplexer 163 receives the current decoding signal $I_{BATCD}(t_n)$, wherein the comparison table 162 is the relation formula between the discharging current and the modifying parameter N in FIG. 5. In this embodiment, the first multiplexer 163 obtains the corresponded modifying parameter N on the basis of five most significant bits (5 MSB) of the current decoding signal $I_{BATCD}(t_n)$ and the comparison table 162. The first multiplier 164 multiplies the current decoding signal $I_{BATCD}(t_n)$ with the modifying parameter N and performs appropriate bit shifting, the modifying current signal $I_{CALIB}(t_n)$ is obtained after required bit numbers have remained. The modifying current signal $I_{CALIB}(t_n)$ approaches the recovery current of the battery set considerably for making the Coulomb integral circuit 170 precisely obtain the electrical capacity of the battery set therefore preventing estimated electrical capacity from being smaller than actual electrical capacity. By the specific modifying parameter N obtained from the comparison table 162, when the present invention applies to different types of batteries, we may only change the stored numbers in the comparison table 162 to make the current-estimated circuit 120 adaptive to multi types of batteries.

With reference to FIG. 2, in this embodiment, the Coulomb integral circuit 170 comprises a first register 171, a second register 172, a second multiplier 173, a first adder 174 and a third register 175. The first register 171 receives the symbol bit SIGN of the current decoder 161 and a first pulse signal CLK_1, the symbol bit SIGN is stored in the first register 171 via trigger of the first pulse signal CLK_1. The symbol bit SIGN is used to judge positive/negative value of the modifying current signal $I_{CALIB}(t_n)$ and input to the first adder 174 for determining that the Coulomb integral circuit 170 continuously accumulates electrical capacity while the battery set is in charge or the Coulomb integral circuit 170 continuously decreases to electrical capacity while the battery set is in discharge. The second register 172 receives the modifying current signal $I_{CALIB}(t_n)$ and the first pulse signal CLK_1 and stores the modifying current signal $I_{CALIB}(t_n)$ via trigger of the first pulse signal CLK_1, the second multiplier 173 receives the modifying current signal $I_{CALIB}(t_{n-1})$ stored in the second register 172 and a sampling time Δt and multiplies the modifying current signal $I_{CALIB}(t_{n-1})$ with the sampling time Δt to obtain a product signal $I_{CALIB}(t_{n-1})$ Δt, the first adder 174 adds a former estimated electrical-capacity value $Q_{CALIB}(t_{n-1})$ to the product signal $I_{CALIB}(tn-1)$ Δt to obtain the estimated electrical-capacity value $Q_{CALIB}(t_n)$, the third register 175 receives the estimated electrical-capacity value $Q_{CALIB}(t_n)$, the first pulse signal CLK_1, the current-estimated reset signal reset_C-CEA and a low voltage electrical-capacity value $Q_L(t_n)$ for storing the estimated electrical-capacity value $Q_{CALIB}(t_n)$ via trigger of the first pulse signal CLK_1. The current-estimated reset signal reset_CCEA is used for resetting the third register 175, the low voltage electrical-capacity value $Q_L(t_n)$ is the pre-determined value of the third register 175, and the third register 175 outputs the former estimated electrical-capacity value $Q_{CALIB}(t_{n-1})$. The Coulomb integral circuit 170 integrates the modifying current signal $I_{CALIB}(t_n)$ accomplished by the second register 172, the second multiplier 173, the first adder 174 and the third register 175 for estimating a charge/discharge electrical-capacity value of the battery set in a period of time.

Figure 3:
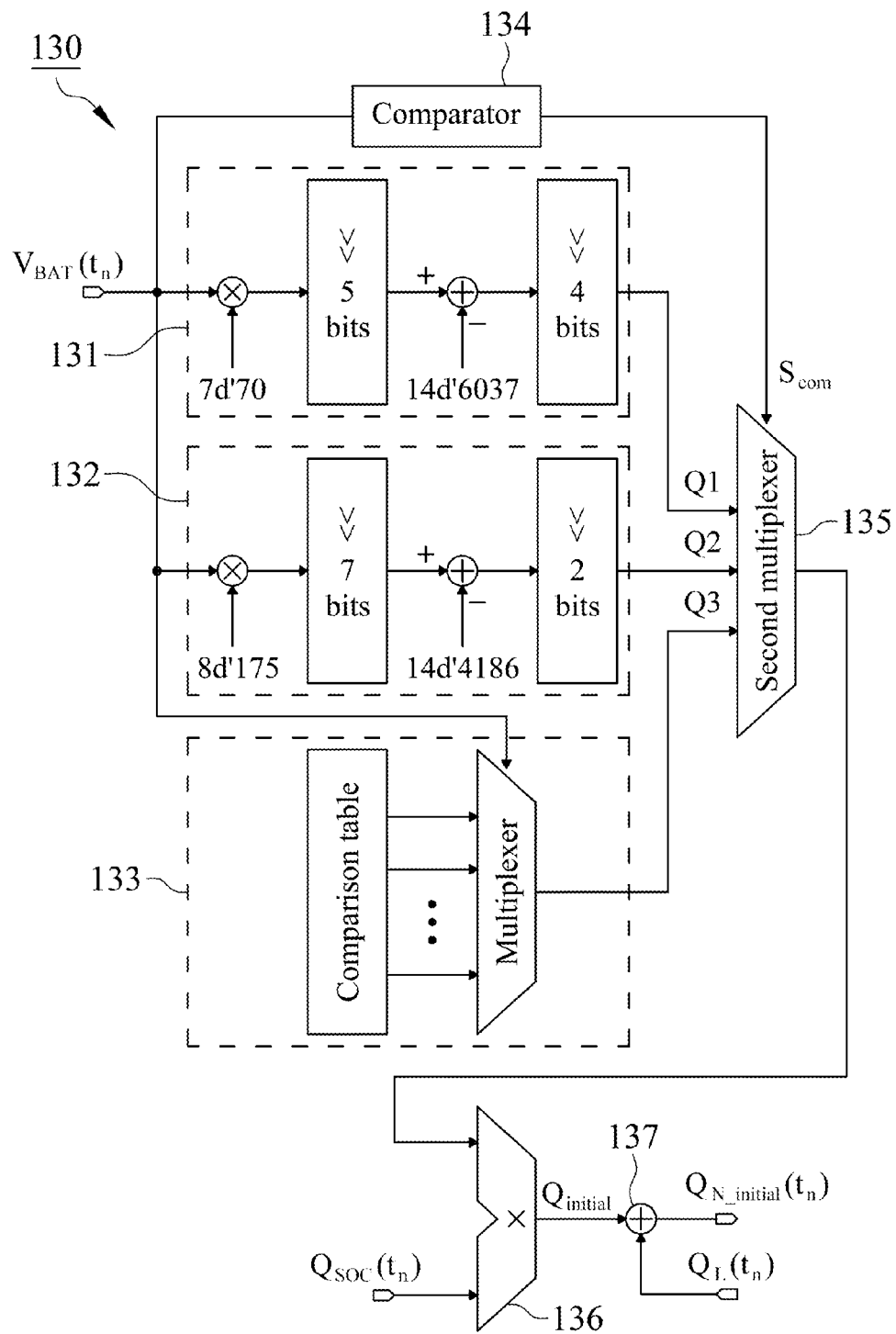
FIG. 3 is a function block diagram illustrating an open-circuit voltage detection circuit in accordance with the embodiment of the present invention.
Figure 6:
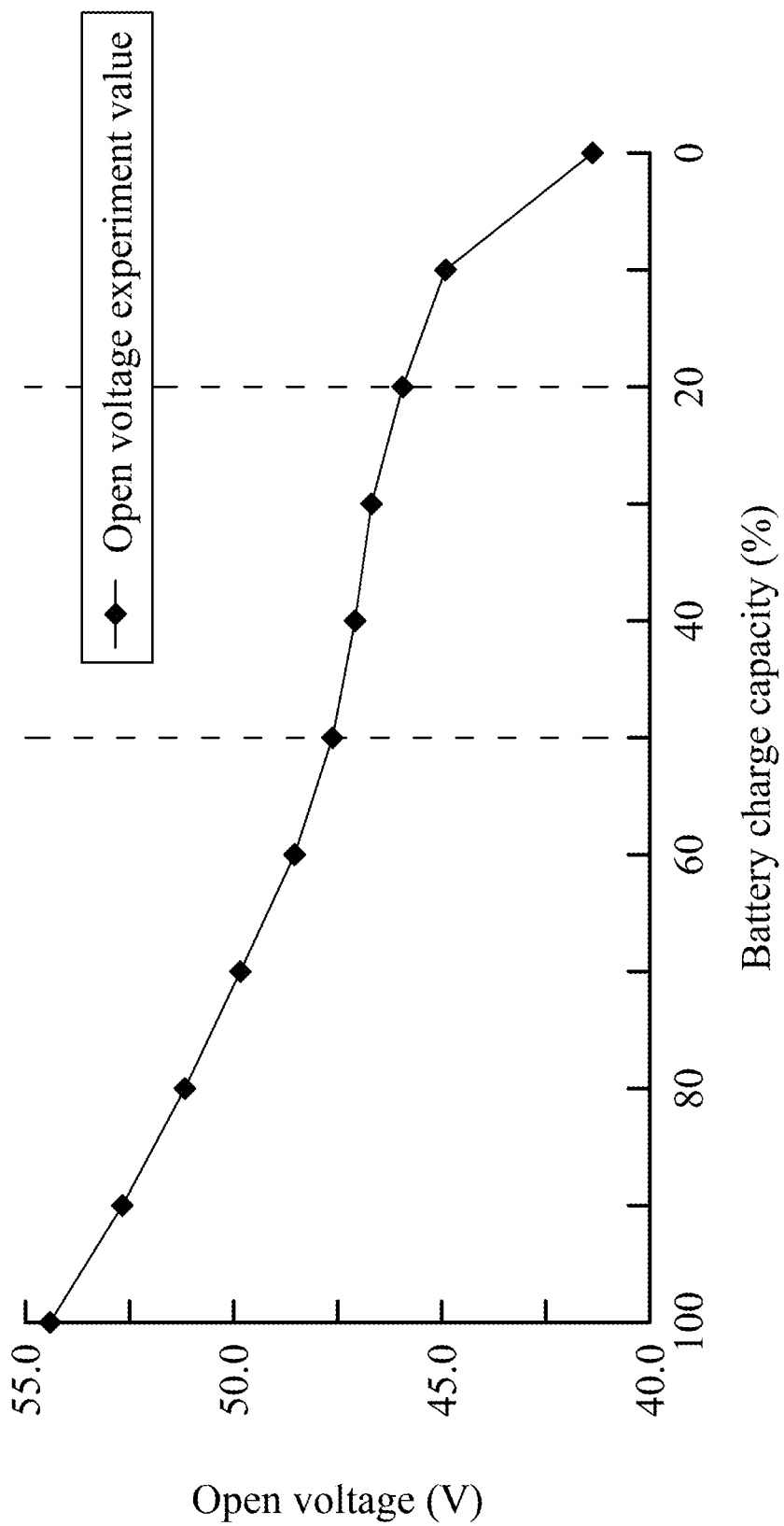
FIG. 6 is a relationship diagram between a battery charge capacity and an open circuit voltage in accordance with the embodiment of the present invention.

With reference to FIGS. 1 and 3, in this embodiment, the open-circuit voltage detection circuit 130 obtains a battery charge electrical-capacity corresponded to open-circuit voltage of the battery set by way of table lookup. Referring to FIG. 6, the acquisition of the numbers is to do experiment in advance: making the battery set charging to a charge cut-off voltage by constant current discharging; switching the mode of charge from constant current to constant voltage and charging to the charge current that is less than 100 mA; successively discharging the battery set to 90%, 80%, 70%, 60%, 50%, 40%, 30%, 20%, 10% and 0% of its rated capacity by various magnitudes of constant-value discharging currents and recording their corresponding open-circuit voltage. The experiment value is illustrated in FIG. 6, the relationship between battery charge capacity of the battery set and the open-circuit voltage can be divided into three zones 100% to 50%, 50% to 20% and 20% to 0%, wherein battery charge capacity in 100% to 50% and 50% to 20% nearly exhibits linear relationship.

With reference to FIG. 3, in this embodiment, the open-circuit voltage detection circuit 130 comprises a first operation unit 131, a second operation unit 132, a third operation unit 133, a comparator 134, a second multiplexer 135, a third multiplier 136 and a second adder 137, wherein the first operation unit 131 receives the voltage signal $V_{BAT}(t_n)$ for calculating a first battery capacity state Q1, the second operation unit 132 receives the voltage signal $V_{BAT}(t_n)$ for calculating a second battery capacity state Q2, the third operation unit 133 receives the voltage signal $V_{BAT}(tn)$ for calculating a third battery capacity state Q3, wherein the first operation unit 131, the second operation unit 132 and the third operation unit 133 correspond to three areas of FIG. 6 respectively. Owing to battery charge capacity in areas 100% to 50% and 50% to 20% exhibited linear relationship, thus, the first operation unit 131 and the second operation unit 132 obtain the electrical-capacity value corresponding to the voltage signal $V_{BAT}(t_n)$ via linear calculation, and the third operation unit 133 obtain the electrical-capacity value corresponding to the voltage signal $V_{BAT}(t_n)$ via table lookup. The second multiplexer 135 receives the first battery capacity state Q1, the second battery capacity state Q2 and the third battery capacity state Q3, the comparator 134 receives the voltage signal $V_{BAT}(t_n)$ and outputs a comparison signal $S_{com}$ on the basis of the voltage signal $V_{BAT}(t_n)$. The comparator 134 is used for judging which areas in FIG. 6 the voltage signal $V_{BAT}(t_n)$ situates to control the second multiplexer 135 to optionally output the first battery capacity state Q1, the second battery capacity state Q2 or the third battery capacity state Q3 to the third multiplier 136. The third multiplier 136 multiplies received signal with a total capacity value of battery $Q_{SOC}(t_n)$ and adds the signal stored in the low voltage register 153 via the second adder 137 for obtaining the initial electrical-capacity value $Q_{N\_initial}(t_n)$. The relationship between the battery charge capacity of the battery set and the open circuit voltage divided into three areas merely illustrates this embodiment. As for other types of batteries, the relationship must set upon experiment data.

With reference to FIG. 1, the optional multiplexer 140 receives the estimation optional signal sel_predit of the control circuit 110, the estimating electrical-capacity value $Q_{CALIB}(t_n)$ of the current estimation circuit 120 and the initial electrical-capacity value $Q_{N\_initial}(t_n)$ of the open-circuit voltage detection circuit 130 and outputs an estimating electrical-capacity signal $Q_{predit}$, wherein the optional multiplexer 140 determines that the estimating electrical-capacity signal $Q_{predit}$ equals to the estimating electrical-capacity value $Q_{CALIB}(t_n)$ initial electrical-capacity value $Q_{N\_initial}(t_n)$.

Figure 4:
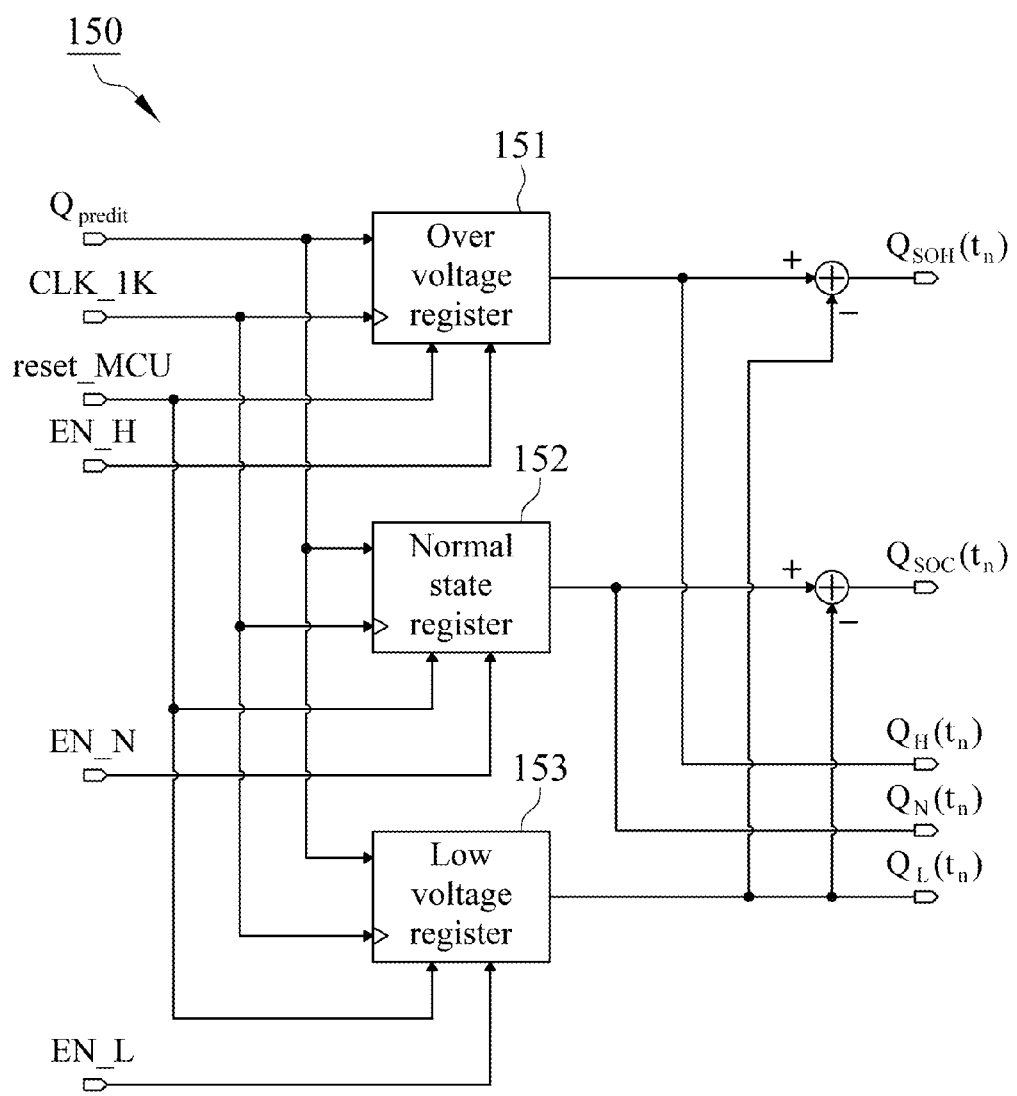
FIG. 4 is a function block diagram illustrating an electrical-capacity calculation circuit in accordance with the embodiment of the present invention.

With reference to FIGS. 1 and 4, the electrical-capacity calculation circuit 150 comprises an over voltage register 151, a normal state register 152 and a low voltage register 153, wherein the over voltage register 151 receives the estimating electrical-capacity signal $Q_{predit}$, the electrical-capacity calculation reset signal reset_MCU and the over voltage enable signal EN_H, the normal state register 152 receives the estimating electrical-capacity signal $Q_{predit}$, the electrical-capacity calculation reset signal reset_MCU and the normal state enable signal EN_N, the low voltage register 153 receives the estimating electrical-capacity signal $Q_{predit}$, the electrical-capacity calculation reset signal reset_MCU and the low voltage enable signal EN_L, wherein the over voltage register 151, the normal state register 152 and the low voltage register 153 determine whether to store the estimating electrical-capacity signal $Q_{predit}$ is controlled by the over voltage enable signal EN_H, the normal state enable signal EN_N and the low voltage enable signal EN_L respectively, wherein the over voltage register 151, the normal state register 152 and the low voltage register 153 receive a second pulse signal CLK_1K and stores the estimating electrical-capacity signal $Q_{predft}$ via trigger of the second pulse signal CLK_1K. The difference value between a present electrical-capacity value $Q_N(t_n)$ stored in the normal state register 152 and a low voltage electrical-capacity value $Q_L(t_n)$ stored in the low voltage register 153 is a battery electrical-capacity remaining signal $Q_{SOC}(t_n)$, and the difference value between an over voltage electrical-capacity value $Q_H(t_n)$ stored in the over voltage register 151 and the low voltage electrical-capacity value $Q_L(t_n)$ stored in the low voltage register 153 is a battery state of health signal $Q_{SOH}(t_n)$.

Referring to FIG. 1, the first pulse signal CLK_1 and the second pulse signal CLK_1K are outputted by the frequency divider 180. The frequency divider 180 receives an input frequency signal CLKin_1K and divides the input frequency signal CLKin_1K as the first pulse signal CLK_1 and the second pulse signal CLK_1K, wherein the frequency of the first pulse signal CLK_1 is different from that of the second pulse signal CLK_1K. Preferably, the frequency of the second pulse signal CLK_1K is larger than the first pulse signal CLK_1. In this embodiment, the frequency of the first pulse signal CLK_1 is 1 Hz, and the frequency of the second pulse signal CLK_1K is 1 k Hz. With reference to FIG. 2, for the reason that the Coulomb integral circuit 170 obtains the estimating electrical-capacity value $Q_{CALIB}(t_n)$ necessarily by calculation of the second multiplier 173 and the first adder 174. Therefore, the first pulse signal CLK_1 with lower frequency prevents the Coulomb integral circuit 170 from overly long period of operation time.

With reference to FIGS. 1 and 7, the circuit action of the present invention mainly operates in six modes, wherein the control circuit 110 operates in a reset mode, an OCV (open circuit voltage) buffer mode, an OCV mode, an over-voltage mode, a under-voltage mode and a normal mode respectively on the basis of the reset signal RESET, the voltage signal $V_{BAT}(t_n)$ and the current signal $I_{BAT}(t_n)$. The control circuit 110 determines whether to enter the reset mode via the reset signal RESET, the user may set the reset signal RESET as high voltage level (or low voltage level) for entering the reset mode, same time, the electrical-capacity calculation reset signal reset_MCU and the current-estimated reset signal reset_CCEA are high voltage level. Therefore, referring to FIGS. 2 and 5, the third register 175 of the Coulomb integral circuit 170, the over voltage register 151, the normal state register 152 and the low voltage register 153 of the electrical-capacity calculation circuit 150 are reset by the electrical-capacity calculation reset signal reset_MCU and the current-estimated reset signal reset_CCEA.

With reference to FIGS. 1 and 7, when the current signal $I_{BAT}(t_n)$ received by the control circuit 110 is smaller than a pre-determined value (load terminal is considered to be open circuit, the pre-determined value depends upon capacity of the battery set) and the voltage signal $V_{BAT}(t_n)$ is not able to maintain stabilization in a pre-determined time, the control circuit 110 enters the OCV buffer mode, same time, the electrical-capacity calculation reset signal reset_MCU, the over voltage enable signal EN_H, the normal state enable signal EN_N and the low voltage enable signal EN_L are low voltage level for shutting down the over voltage register 151, the normal state register 152 and the low voltage register 153 and waiting for stabilization of the voltage signal $V_{BAT}(t_n)$.

With reference to FIGS. 1 and 7, when the current signal $I_{BAT}(t_n)$ received by the control circuit 110 is smaller than the pre-determined value and the voltage signal $V_{BAT}(t_n)$ maintains stabilization in the pre-determined time, the control circuit 110 enters the OCV mode, wherein the electrical-capacity calculation reset signal reset_MCU and the estimation optional signal sel_predit are low voltage level. The estimation optional signal sel_predit outputted from the control circuit 110 enables the estimating electrical-capacity signal $Q_{predit}$ outputted from the optional multiplexer 140 equal to the initial electrical-capacity value $Q_{N\_initial}(t_n)$, and the normal state enable signal EN_N is changed to high voltage level for making the estimating electrical-capacity signal $Q_{predit}$ being stored in the normal state register 152, same time, the present electrical-capacity value $Q_N(t_n)$ stored in the normal state register 152 is the initial electrical-capacity value $Q_{N\_initial}(t_n)$ of the open-circuit voltage detection circuit 130 obtained by the voltage signal, which also represents present remaining electrical-capacity of the battery set.

With reference to FIGS. 1 and 7, when the voltage signal $V_{BAT}(t_n)$ received by the control circuit 110 is larger than the charging cut-off voltage, the control circuit 110 enters the over-voltage mode, wherein the current-estimated reset signal reset_CCEA is low voltage level for making the Coulomb integral circuit 170 perform integration of electrical-capacity, same time, the estimation optional signal sel_predit is high voltage level. The estimation optional signal sel_predit enables the estimating electrical-capacity signal $Q_{predit}$ outputted from the optional multiplexer 140 equal to the estimating electrical-capacity value $Q_{CALIB}(t_n)$, and the over voltage enable signal EN_H and the normal state enable signal EN_N change to high voltage level for making the estimating electrical-capacity signal $Q_{predit}$ stored in the over voltage register 151 and the normal state register 152. Referring to FIGS. 1, 2 and 4, in the mentioned OCV mode, the initial electrical-capacity value $Q_{N\_initial}(t_n)$ is stored in the normal state register 142, therefore, in the over voltage mode, the Coulomb integral circuit 175 enables to perform integration of electrical-capacity by using the present electrical-capacity value $Q_N(t_n)$ as initial value and store its calculation result in the over voltage register 151 and the normal state register 152. Besides, owing to the voltage signal $V_{BAT}(t_n)$ in this mode larger than the charge cut-off voltage, thus, the over voltage electrical-capacity value $Q_H(t_n)$ stored in the over voltage register 151 can be considered as maximum electrical-capacity value that can be stored by the battery set so far.

With reference to FIGS. 1 and 7, when the voltage signal $V_{BAT}(t_n)$ received by the control circuit 110 is smaller than the discharge cut-off voltage, the control circuit 110 enters the under-voltage mode, wherein the current-estimated reset signal reset_CCEA is low voltage level for making the Coulomb integral circuit 170 perform integration of electrical-capacity, the estimation optional signal sel_predit is high voltage level. The estimation optional signal sel_predit enables the estimating electrical-capacity signal $Q_{predit}$ outputted from the optional multiplexer 140 equal to the estimating electrical-capacity value $Q_{CALIB}(t_n)$, and the low voltage enable signal EN_L and the normal state enable signal EN_N change to high voltage level for making the estimating electrical-capacity signal $Q_{predit}$ being stored in the low voltage register 153 and the normal state register 152. Owing to the voltage signal $V_{BAT}(t_n)$ in this mode smaller than the discharge cut-off voltage, thus, the low voltage electrical-capacity value $Q_L(tn)$ stored in the low voltage register 153 is considered to be minimum electrical-capacity that can be stored by the battery set so far.

With reference to FIGS. 1 and 7, when the voltage signal $V_{BAT}(t_n)$ received by the control circuit 110 is not less than the discharge cut-off voltage and not larger than the charge cut-off voltage, the control circuit 110 enters the normal mode, wherein the current-estimated reset signal reset_CCEA is low voltage level for making the Coulomb integral circuit 170 perform integration of electrical-capacity, the estimation optional signal sel_predit is high voltage level. The estimation optional signal sel_predit enables the estimating electrical-capacity signal $Q_{predit}$ outputted from the optional multiplexer 140 equal to the estimating electrical-capacity value $Q_{CALIB}(t_n)$, and the normal state enable signal EN_N changes to high voltage level for making the estimating electrical-capacity signal $Q_{predit}$ being stored in the normal state register 152. Same time, the present electrical-capacity value $Q_N(t_n)$ stored in the normal state register 152 represents electrical-capacity value of the battery set so far.

With reference to FIG. 4, owing to the over voltage electrical-capacity value $Q_H(t_n)$ stored in the over voltage register 151 considered to be maximum electrical-capacity value that can be stored in the battery set so far and the low voltage electrical-capacity value $Q_L(t_n)$ stored in the low voltage register 153 considered to be minimum electrical-capacity value that can be stored in the battery set so far, therefore, the difference value between the over voltage electrical-capacity value $Q_H(t_n)$ and the low voltage electrical-capacity value $Q_L(t_n)$ is the battery state of heath signal $Q_{SOH}(t_n)$ of the battery set. Besides, owing to the present electrical-capacity value $Q_N(t_n)$ stored in the normal state register 152 representing present electrical-capacity value of the battery set, thus, the difference value between the present electrical-capacity value $Q_N(t_n)$ and the low voltage electrical-capacity value $Q_L(t_n)$ is the battery electrical-capacity remaining signal $Q_{SOC}(t_n)$ of the battery set. The state of charge of the battery set is obtained by the battery electrical-capacity remaining signal $Q_{SOC}(t_n)$ divided with the battery state of health signal $Q_{SOH}(t_n)$.

With reference to FIG. 1, the estimation circuit 100 of state of charge and state of health further includes a multiplexer 190 for receiving the battery electrical-capacity remaining signal $Q_{SOC}(t_n)$, the battery state of health signal $Q_{SOH}(t_n)$, the over voltage electrical-capacity value $Q_H(t_n)$, the present electrical-capacity value $Q_N(t_n)$, the low voltage electrical-capacity value $Q_L(t_n)$ and an output optional signal Dout_sel, wherein the output optional signal Dout_sel is inputted by the user through a user interface for determining an output signal DATAOUT outputted from the multiplexer 190 is the battery electrical-capacity remaining signal $Q_{SOC}(t_n)$, the battery state of health signal $Q_{SOH}(t_n)$, the over voltage electrical-capacity value $Q_H(t_n)$, the present electrical-capacity value $Q_N(t_n)$, the low voltage or electrical-capacity value $Q_L(t_n)$ and thereafter indicating on the user interface.

In this invention, the control circuit 110 may operate under six modes and stores the initial electrical-capacity value $Q_{N\_initial}(t_n)$ or the electrical-capacity value $Q_{CALIB}(t_n)$ respectively into the over voltage register 151, the normal state register 152 and the low voltage register 153 for obtaining the state of charge and state of health of battery. Besides, the current estimation circuit 120 modifies the current signal $I_{BAT}(t_n)$ via the current modification circuit 160 to make the modifying current signal $I_{CALIB}(t_n)$ approaching the recovery current and enables the Coulomb integral circuit 170 to precisely estimate electrical-capacity value of the battery.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:
1. An estimation circuit for determining a State of Charge (SOC) and a State of Health (SOH) of a battery includes:
  a control circuit configured for receiving a reset signal, a voltage signal and a current signal, wherein the control circuit is further configured to determine a voltage level of an electrical-capacity calculation reset signal, an estimation optional signal, an over voltage enable signal, a normal state enable signal, a low voltage enable signal and a current-estimated reset signal configured to be outputted from the control circuit according to the reset signal, the voltage signal and the current signal;
  a current estimation circuit having a current modification circuit and a Coulomb integral circuit, wherein the current modification circuit is configured to receive the current signal and multiply the current signal by a modification parameter and output a modified current signal, the Coulomb integral circuit is configured to receive the modified current signal and the current-estimated reset signal of the control circuit and integrate the modified current signal to output an estimating electrical-capacity value;
  an open-circuit voltage detection circuit configured for receiving the voltage signal, wherein the open-circuit voltage detection circuit is configured to output an initial electrical-capacity value according to the voltage signal;
  a multiplexer configured for receiving the estimation optional signal of the control circuit, the estimating electrical-capacity value of the current estimation circuit and the initial electrical-capacity value of the open-circuit voltage detection circuit, wherein the multiplexer is configured to output an estimating electrical-capacity signal and determine the estimating electrical-capacity signal equal to the estimating electrical-capacity value or the initial electrical-capacity value according to the estimation optional signal; and
  an electrical-capacity calculation circuit having an over voltage register, a normal state register and a low voltage register, wherein the over voltage register is configured to receive the estimating electrical-capacity signal, the electrical-capacity calculation reset signal and the over voltage enable signal, the normal state register is configured to receive the estimating electrical-capacity signal, the electrical-capacity calculation reset signal and the normal state enable signal, the low voltage register receives the estimating electrical-capacity signal, the electrical-capacity calculation reset signal and the low voltage enable signal, wherein the over voltage register, the normal state register and the low voltage register are configured to determine whether to store the estimating electrical-capacity signal controlled by the over voltage enable signal, the normal state enable signal and the low voltage enable signal respectively,
  wherein the electrical-capacity calculation circuit is configured to determine the SOC of the battery using a signal stored in the normal state register and a signal stored in the low voltage register, and wherein the electrical-capacity calculation circuit is configured to determine the SOH of the battery using a signal stored in the over voltage register and the signal stored in the low voltage register.

2. The estimation circuit in accordance with claim 1, wherein the current modification circuit comprises a current decoder, a comparison table, a first multiplexer and a first multiplier, the current decoder is configured to receive the current signal and decode the current signal to generate a symbol bit and a current decoding signal, the first multiplexer is configured to receive the current decoding signal and output the modifying parameter on the basis of the current decoding signal and the comparison table, the first multiplier is configured to multiply the current decoding signal with the modifying parameter to obtain the modified current signal.

3. The estimation circuit in accordance with claim 2, wherein the Coulomb integral circuit comprises a first register, a second register, a second multiplier, a first adder and a third register, wherein the first register is configured to receive the symbol bit of the current decoder and a first pulse signal, the second register is configured to receive the modified current signal and the first pulse signal and to store the modified current signal, the second multiplier is configured to receive the modified current signal stored in the second register and a sampling time and to multiply the modified current signal with the sampling time to obtain a product signal, the first adder is configured to add a former estimated electrical-capacity value to the product signal to obtain the estimating electrical-capacity value, the third register is configured to receive the estimating electrical-capacity value and the first pulse signal and to store the estimating electrical-capacity value, and the third register is configured to output the former estimated electrical-capacity value.

4. The estimation circuit in accordance with claim 3, wherein the over voltage register, the normal state register and the low voltage register are configured to receive a second pulse signal to make the over voltage register, the normal state register and the low voltage register store the estimating electrical-capacity signal via trigger of the second pulse signal.

5. The estimation circuit in accordance with claim 4 further includes a frequency divider configured to output the first pulse signal and the second pulse signal, wherein a frequency of the first pulse signal is less than that of the second pulse signal.

6. The estimation circuit in accordance with claim 1, wherein the open-circuit voltage detection circuit comprises a first operation unit, a second operation unit, a third operation unit, a comparator, a second multiplexer, a third multiplier and a second adder, wherein the first operation unit is configured to receive the voltage signal and calculate a first battery capacity state, the second operation unit is configured to receive the voltage signal and calculate a second battery capacity state, the third operation unit is configured to receive the voltage signal and calculate a third battery capacity state, the second multiplexer is configured to receive the first battery capacity state, the second battery capacity state, and the third battery capacity state, the comparator is configured to receive the voltage signal and control the second multiplexer to output the first battery capacity state, the second battery capacity state or the third battery capacity state to the third multiplier according to the voltage signal, the third multiplier is configured to multiply the received signal with a total battery capacity value and add the signal stored in the low voltage register via the second adder to obtain the initial electrical-capacity value.

7. The estimation circuit in accordance with claim 1, wherein the control circuit is configured to enter into a reset mode via the reset signal, wherein the electrical-capacity calculation reset signal and the current-estimated reset signal are high voltage level for resetting the current estimation circuit and the electrical-capacity calculation circuit.

8. The estimation circuit in accordance with claim 1, wherein the current signal received by the control circuit is smaller than a pre-determined value and the voltage signal is not able to maintain stabilization in a pre-determined time, wherein the control circuit is configured to enter an open circuit voltage (OCV) buffer mode, wherein the electrical-capacity calculation reset signal, the over voltage enable signal, the normal state enable signal and the low voltage enable signal are low voltage level for shutting down the over voltage register, the normal state register and the low voltage register.

9. The estimation circuit in accordance with claim 1, wherein the current signal received by the control circuit is smaller than a pre-determined value and the voltage signal maintains stabilization in a pre-determined time, wherein the control circuit is configured to enter an open circuit voltage (OCV) mode, wherein the estimation optional signal outputted from the control circuit is configured to enable the estimating electrical-capacity signal outputted from the multiplexer equal to the initial electrical-capacity value, and the normal state enable signal is configured to change to high voltage level for making the estimating electrical-capacity signal stored in the normal state register.

10. The estimation circuit in accordance with claim 1, wherein the voltage signal received by the control circuit is larger than a charging cut-off voltage, the control circuit is configured to enter an over voltage mode, wherein the estimation optional signal outputted from the control circuit is configured to enable the estimating electrical-capacity signal outputted from the multiplexer to be equal to the estimating electrical-capacity value, and the over voltage enable signal and the normal state enable signal is configured to change to high voltage level for making the estimating electrical-capacity signal stored in the over voltage register and the normal state register.

11. The estimation circuit in accordance with claim 1, wherein the voltage signal received by the control circuit is smaller than a discharge cut-off voltage, the control circuit is configured to enter a under voltage mode, wherein the estimation optional signal outputted from the control circuit is configured to enable the estimating electrical-capacity signal outputted from the multiplexer to be equal to the estimating electrical-capacity value, and the low voltage enable signal and the normal state enable signal is configured to change to high voltage level for making the estimating electrical-capacity signal stored in the low voltage register and the normal state register.

12. The estimation circuit in accordance with claim 1, wherein the voltage signal received by the control circuit is not less than a discharge cut-off voltage and not larger than a charge cut-off voltage, the control circuit is configured to enter a normal mode, wherein the estimation optional signal outputted from the control circuit is configured to enable the estimating electrical-capacity signal outputted from the multiplexer to be equal to the estimating electrical-capacity value, and the normal state enable signal is configured to change to high voltage level for making the estimating electrical-capacity signal stored in the normal state register.

13. The estimation circuit in accordance with claim 1, wherein the formula of the modification parameter is:

$$\text{Modifying parameter} = \frac{\text{Recovery current}(A)}{\text{Discharging current}(A)},$$

and the formula of a recovery current is:

$$\text{Recovery current}(A) = \frac{\text{Rated capacity}(Ah)}{\text{Discharging time}(h)}.$$

* * * * *